(12) United States Patent
Kondou et al.

(10) Patent No.: US 7,727,489 B2
(45) Date of Patent: Jun. 1, 2010

(54) PLASMA REACTOR

(75) Inventors: Atsuo Kondou, Okazaki (JP);
Yasumasa Fujioka, Nagoya (JP);
Takeshi Sakuma, Nagoya (JP);
Masaaki Masuda, Nagoya (JP); Kenji Dosaka, Shioya-gun (JP); Keizo Iwama, Shioya-gun (JP)

(73) Assignees: NGK Insulators, Ltd., Nagoya (JP);
Honda Motor Co., Ltd., Tokyo (JP)

( * ) Notice: Subject to any disclaimer, the term of this patent is extended or adjusted under 35 U.S.C. 154(b) by 1114 days.

(21) Appl. No.: 11/374,120

(22) Filed: Mar. 14, 2006

(65) Prior Publication Data

US 2006/0208650 A1 Sep. 21, 2006

(30) Foreign Application Priority Data

Mar. 18, 2005 (JP) ............................ 2005-079780

(51) Int. Cl.
*B01J 19/08* (2006.01)
(52) U.S. Cl. ................................. 422/186.04
(58) Field of Classification Search ............. 42/186.04;
422/186.04
See application file for complete search history.

(56) References Cited

U.S. PATENT DOCUMENTS 4,159,425 A * 6/1979 Lowther ................. 422/186.08
4,682,266 A * 7/1987 Huynh et al. ............... 361/235
6,245,299 B1    6/2001 Shiloh et al.
6,274,006 B1 * 8/2001 Kawamura et al. .......... 204/164
6,482,368 B2   11/2002 Hemingway et al.
2002/0076368 A1  6/2002 Hemingway et al.

FOREIGN PATENT DOCUMENTS

| EP | 1 426 102 A2 | 6/2004 |
| EP | 1 645 730 A1 | 4/2006 |
| JP | A-3089213 | 7/2000 |
| JP | A-2001-193441 | 7/2001 |
| WO | WO 91/02581 A1 | 3/1991 |
| WO | WO 99/47242 A1 | 9/1999 |
| WO | WO 2005/005798 A1 | 1/2005 |

* cited by examiner

*Primary Examiner*—Kishor Mayekar
(74) *Attorney, Agent, or Firm*—Oliff & Berridge, PLC (57) ABSTRACT

A plasma reactor is provided with two or more plasma generating electrodes which are installed in series inside a gas passage in a casing, with each plasma generating electrode being electrically controlled independently. The surface area of the conductor on each unit electrode forming the plasma generating electrode installed on the upstream side of the gas passage is smaller than the surface area of the conductor on the unit electrode forming the plasma generating electrode installed on the downstream side of the gas passage. Plasma can be generated between each of the unit electrodes by supplying each of the plasma generating electrodes with independently controlled electric power. The plasma reactor can efficiently react specific components contained in the gas passing through the gas passage.

12 Claims, 5 Drawing Sheets

PLASMA REACTOR

BACKGROUND OF THE INVENTION

1. Field of the Invention

The present invention relates to a plasma reactor. More particularly, the invention relates to a plasma reactor which can reduce the electric power required for generating plasma and can efficiently react components contained in the gas passing through a gas passage.

2. Description of Related Art

In order to remove particulate matter contained in exhaust gas from a diesel engine and the like or to oxidize nitrogen monoxide (NO) into nitrogen dioxide ($NO_2$), a plasma reactor equipped with plasma generating electrodes such as parallel plate-type electrodes, coaxial cylinder-type electrodes, or packed bed-type electrodes is used (see Patent Documents 1 to 3). When using such a plasma reactor, each plasma generating electrode installed in the plasma reactor is connected to one power supply, such as a pulse power supply.

The plasma generating electrodes used in such a plasma reactor have a ceramic dielectric installed between opposing electrodes (conductors). Plasma can be generated by applying an alternating or periodic pulse voltage between the opposing electrodes to produce a silent discharge. Patent Document 2, for example, discloses a plasma reactor having one reaction board (electrode) or two or more segmented reaction boards. Specifically, the patent specification shows a drawing in which a plurality of reaction boards (electrodes) are arranged on the surface of one ceramic dielectric. Patent Document 3 discloses a multi stage reactor having two or more reaction vessels installed in series, in which the reaction vessels on the downstream side are designed to be less energized than the reaction vessels on the upstream side.

(Patent Document 1) Japanese Patent Application Laid-open No. 2001-193441

(Patent Document 2) U.S. Pat. No. 6,482,368

(Patent Document 3) Japanese Patent No. 3089213

SUMMARY OF THE INVENTION

However, an extremely large quantity of electric power is consumed to remove particulate matters or convert NO contained in general combustion exhaust gases by using these plasma reactors. Parallel plate-type plasma generating electrodes, in particular, have a large electrostatic capacity as compared with coaxial cylinder-type plasma generating electrodes which generate plasma in approximately the same magnitude of space. Even if an equivalent amount of energy is set to be supplied from a given power supply source (a pulse power supply) per one pulse, the pulse width (half width) is larger in the parallel plate-type plasma generating electrodes than in the coaxial cylinder-type plasma generating electrodes. If the pulse width (half width) increases, plasma energy is consumed in transferring ions in addition to electrons in the plasma generating space area, resulting in a further decrease in the particulate matters reduction and NO conversion efficiencies. In the multi-stage reactor shown in Patent Document 3, in which a plurality of reactors, each having a structure composed of electrode lines and cylindrical electrodes or electrode lines and plate-like electrodes, are arranged in series, with the reactors on the downstream side being less energized than the reactors on an upstream side, the effective electrode area is too small for removing particles such as particulate matters at a high efficiency. Specifically, a multi-stage reactor as that shown in Patent Document 3 exhibits only a low efficiency of collecting electrostatic dust in the cylinder electrodes or plate electrodes which form each reactor. Since the oxidation reaction (combustion) due to various radicals and the like which continuously occurs along with electric precipitation is not accelerated, the efficiency of removing particulate matters is low.

The invention has been achieved in view of these problems and provides a plasma reactor which can reduce the electric power required for generating plasma and can efficiently treat fluids to be processed.

Specifically, the invention provides the following plasma reactors.

[1] A plasma reactor comprising a plasma generating electrode composed of a plurality of unit electrodes disposed facing vis-à-vis at a prescribed interval, each of the unit electrodes having a plate-like conductor and a ceramic dielectric provided on at least one of the surfaces of the plate-like conductor, a passage for gas containing specific components, and a casing for housing the plasma generating electrode and the gas passage, wherein two or more of the plasma generating electrodes are installed in series inside the gas passage in the casing, with each plasma generating electrode being electrically controlled independently, and a surface area of the conductor of the unit electrode forming the plasma generating electrode installed on the upstream side of the gas passage is smaller than a surface area of the conductor of the unit electrode forming the plasma generating electrode installed on a downstream side of the gas passage, whereby plasma can be generated between each of the unit electrodes by supplying each of the plasma generating electrodes with independently controlled electric power.

[2] The plasma reactor according to [1], wherein two or more of the plasma generating electrodes are installed linearly and in series inside the gas passage in the casing.

[3] The plasma reactor according to [1] or [2], wherein the length of the conductor on each unit electrode forming the plasma generating electrode installed on the downstream side of the gas passage in the gas flow direction is larger than the length of the unit electrode forming the plasma generating electrode installed on the upstream side of the gas passage 6 in the gas flow direction.

[4] The plasma reactor according to any of [1] to [3], wherein the ceramic dielectric on the unit electrode is installed so as to cover both sides of the surface of the conductor.

[5] The plasma reactor according to any of [1] to [4], comprising two or more power supplies, two or more of the plasma generating electrodes being connected to any one of the two or more power supplies and each being electrically controlled independently.

[6] The plasma reactor according to [5], wherein the two or more power supplies are pulse power supplies.

[7] The plasma reactor according to any of [1] to [6], wherein the amount of electric power (W) supplied to each of the plasma generating electrodes is designed so that the electric power per unit area ($W/mm^2$) of the conductors gradually decreases from the plasma generating electrode installed on the upstream side of the gas passage toward the plasma generating electrode installed on the downstream side.

[8] The plasma reactor according to any of [5] to [7], further comprising a control means for integrally controlling the two or more power supplies.

[9] The plasma reactor according to [8], wherein integral control using the control means includes pulse energy control in each of the two or more power supplies and/or pulse repetition cycle control in each of the two or more power supplies.

[10] The plasma reactor according to [8] or [9], wherein the control means integrally controls the two or more power supplies to reduce the pressure difference between the upstream side and the downstream side of the gas passage.

[11] The plasma reactor according to any of [1] to [10], wherein each of the plasma generating electrodes installed inside the gas passage in the casing can be displaced independently.

[12] The plasma reactor according to any one of [5] to [11], wherein each of the two or more electrodes has at least one SI thyristor.

Since the plasma reactor of this invention is provided with two or more plasma generating electrodes which are installed in series inside the gas passage in the casing, with each plasma generating electrode being electrically controlled independently, and the surface area of the conductor of the unit electrode forming the plasma generating electrode installed on the upstream side of the gas passage is smaller than the surface area of the conductor on the unit electrode forming the plasma generating electrode installed on the downstream side of the gas passage, the plasma reactor can reduce the electric power supplied for generating plasma and can efficiently react specific components contained in the gas passing through the gas passage.

DETAILED DESCRIPTION OF THE INVENTION

An embodiment of the plasma reactor according to the invention is described below in detail with reference to the drawings. However, the invention should not be construed as being limited to the following embodiments. Various alterations, modifications, and improvements may be made within the scope of the invention based on the knowledge of a person skilled in the art.

Figure 1:
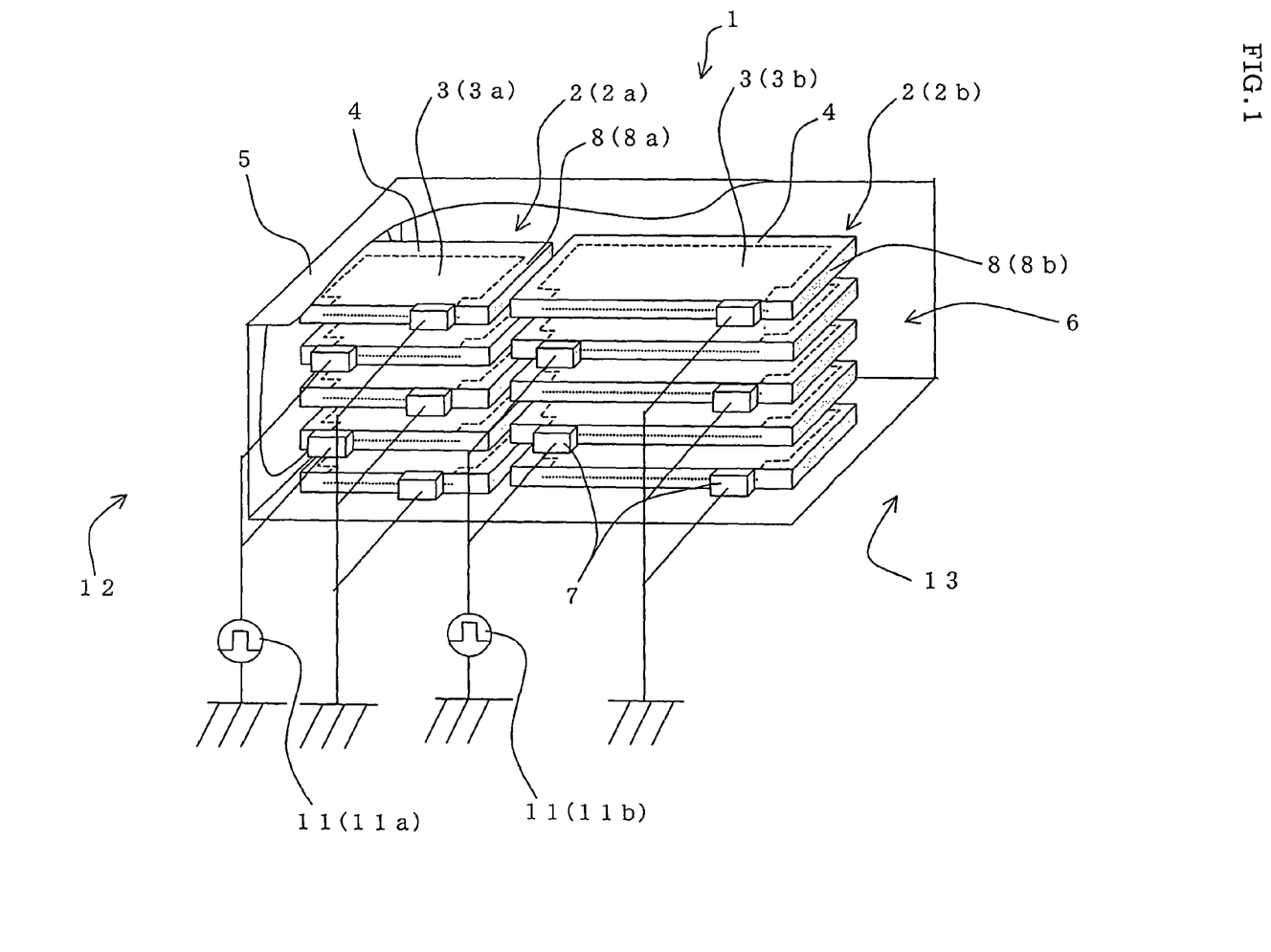
FIG. 1 is a perspective view schematically showing one embodiment of the plasma reactor of the present invention.

FIG. 1 is a perspective view schematically showing one embodiment of a plasma reactor according to the invention. As shown in FIG. 1, the plasma reactor 1 of this embodiment comprises a plasma generating electrode 2 composed of a plurality of unit electrodes 8 disposed facing vis-à-vis at a prescribed interval, each unit electrode 8 having a plate-like conductor 3 and a ceramic dielectric 4 provided on at least one of the surfaces of the plate-like conductor 3, a passage 6 for gas containing specific components, and a casing 5 for housing the plasma generating electrode 2 and the gas passage 6. The plasma reactor 1 is provided with two or more such plasma generating electrodes 2 which are installed in series inside the gas passage 6 in the casing 5, with each plasma generating electrode 2 being electrically controlled independently. The surface area of the conductor 3a of the unit electrode 8a forming the plasma generating electrode 2a installed on the upstream side 12 of the gas passage 6 is smaller than the surface area of the conductor 3b on the unit electrode 8b forming the plasma generating electrode 2b installed on the downstream side 13 of the gas passage 6. Plasma can be generated between each of the unit electrodes 8a and 8b by supplying each of the plasma generating electrodes 2a and 2b with independently controlled electric power.

In this manner, in the plasma reactor 1 of this embodiment, since two or more plasma generating electrodes 2, each electrically controlled independently, are installed in series inside the gas passage 6 in the casing 5, it is possible to efficiently react the specific components contained in the gas passing through the gas passage 6 by decreasing the electrostatic capacity of each plasma generating electrode 2, thereby reducing the electric power (input electric power) supplied for generating plasma. In addition, since the surface area of the conductor 3a on each unit electrode 8a forming the plasma generating electrode 2a installed on the upstream side 12 of the gas passage 6 is smaller than the surface area of the conductor 3b on the unit electrode 8b forming the plasma generating electrode 2b installed on the downstream side 13 of the gas passage 6, the electrostatic capacity of the conductor 3a of unit electrode 8a forming the plasma generating electrode 2a installed on the upstream side 12 is small, even if the plasma generating electrodes 2a and 2b are supplied with an approximately same amount of electric power. Plasma having a high particulate matters removing efficiency, high NO conversion efficiency, and the like can be generated in this manner. As opposed to this, a situation in which the electrostatic capacity of the conductor 3b of unit electrode 8b forming the plasma generating electrode 2b installed on the downstream side 13 is increased, thereby unnecessarily increasing the reaction efficiency and the like, can be avoided.

Generally, when plasma is generated inside a gas passage of a plasma reactor, a chemical reaction of specific components contained in the gas is promoted by dissociated oxygen atoms and hydroxyl (OH) radicals generated in the space in which plasma is generated. For example, when a combustion exhaust gas containing nitrogen monoxide (NO) as the above specific components is passed through the gas passage of the casing, the nitrogen monoxide (NO) is gradually oxidized and converted into nitrogen dioxide ($NO_2$) as the gas flows to the downstream side from the upstream side of the gas passage, and the concentration of nitrogen monoxide (NO) and the like contained in the combustion exhaust gas decreases from the upstream side to the downstream side of the gas passage. For this reason, if the same magnitude of uniformly controlled voltage is applied to all of the conductors installed inside of the gas passage to generate plasma, as in the case of a conventional plasma reactor, the electric power supplied for a given concentration of the components to be reacted is excessive on the downstream side of the gas passage, resulting in a decrease of reaction efficiency of the plasma reactor as a whole.

For example, when a combustion exhaust gas containing nitrogen monoxide (NO) is caused to pass through the gas passage 6 of the plasma reactor 1 of this embodiment shown in FIG. 1, plasma with a high conversion efficiency is generated in upstream side 12 of the gas passage 6, in which the concentration of nitrogen monoxide (NO) is comparatively high, while on the downstream side 13 of the gas passage 6, in which the concentration of nitrogen monoxide (NO) has been reduced, plasma exhibiting a lower conversion efficiency than the plasma on the upstream side 12 is generated in a wider range than on the upstream side 12, so that nitrogen monoxide (NO) which has not been reacted on the upstream side 12 and byproducts thereof can be effectively reacted.

Since the unit electrodes 8a and 8b forming the plasma generating electrodes 2a and 2b have plate-like conductors 3a and 3b, the effectual areas for unit electrodes 8a and 8b in the plasma reactor 1 of this embodiment can be increased. Accordingly, a high electric precipitation efficiency of collecting particulate matters (particulate suspended solid) contained in exhaust gas and the like by the electrodes 8a and 8b can be achieved and the oxidation reaction (combustion) due to various radicals and the like which continuously occurs along with electric precipitation can be accelerated. The plasma reactor 1 is thus suitable for use as an exhaust gas treating device for removing particulate emissions such as particulate matters.

In addition, since two or more plasma generating electrodes 2a and 2b in this plasma reactor 1 are electrically controlled independently, the electric power supplied to each of the plasma generating electrode 2a and 2b can be adjusted according to the concentration of nitrogen monoxide in the gas passage 6. For example, the plasma generating electrode 2a installed on the upstream side 12 of the gas passage 6, in which the concentration of nitrogen monoxide (NO) is comparatively high, is supplied with a comparatively large amount of electric power, whereas the plasma generating electrode 2b installed on the downstream side 13 of the gas passage 6, in which the concentration of nitrogen monoxide (NO) is comparatively low, is supplied with a comparatively small amount of electric power. In this manner, the electric power supplied to the plasma generating electrode 2 can be reduced without decreasing the reaction efficiency of the plasma reactor 1 as a whole.

Usually, the electrostatic capacity of a conductor for generating plasma increases in proportion of the surface area of the conductor. For this reason, a plasma reactor in which all plasma is generated using one plasma generating electrode, as in the conventional plasma reactor, consumes a large amount of electric power and thus exhibits poor energy efficiency. Since the plasma reactor 1 of this embodiment is equipped with two or more plasma generating electrodes 2 (plasma generating electrodes 2a and 2b in FIG. 1), the surface area of each conductor 3 may be about one half of the surface area of the conductor in a conventional plasma reactor. Therefore, the electrostatic capacity of each conductor 3 can be reduced, which in turn decreases the pulse width (half-width) of the plasma generated. In this manner, it is possible to increase the reaction efficiencies such as a particulate matters-removing efficiency, NO conversion efficiency, and the like.

Figure 2:
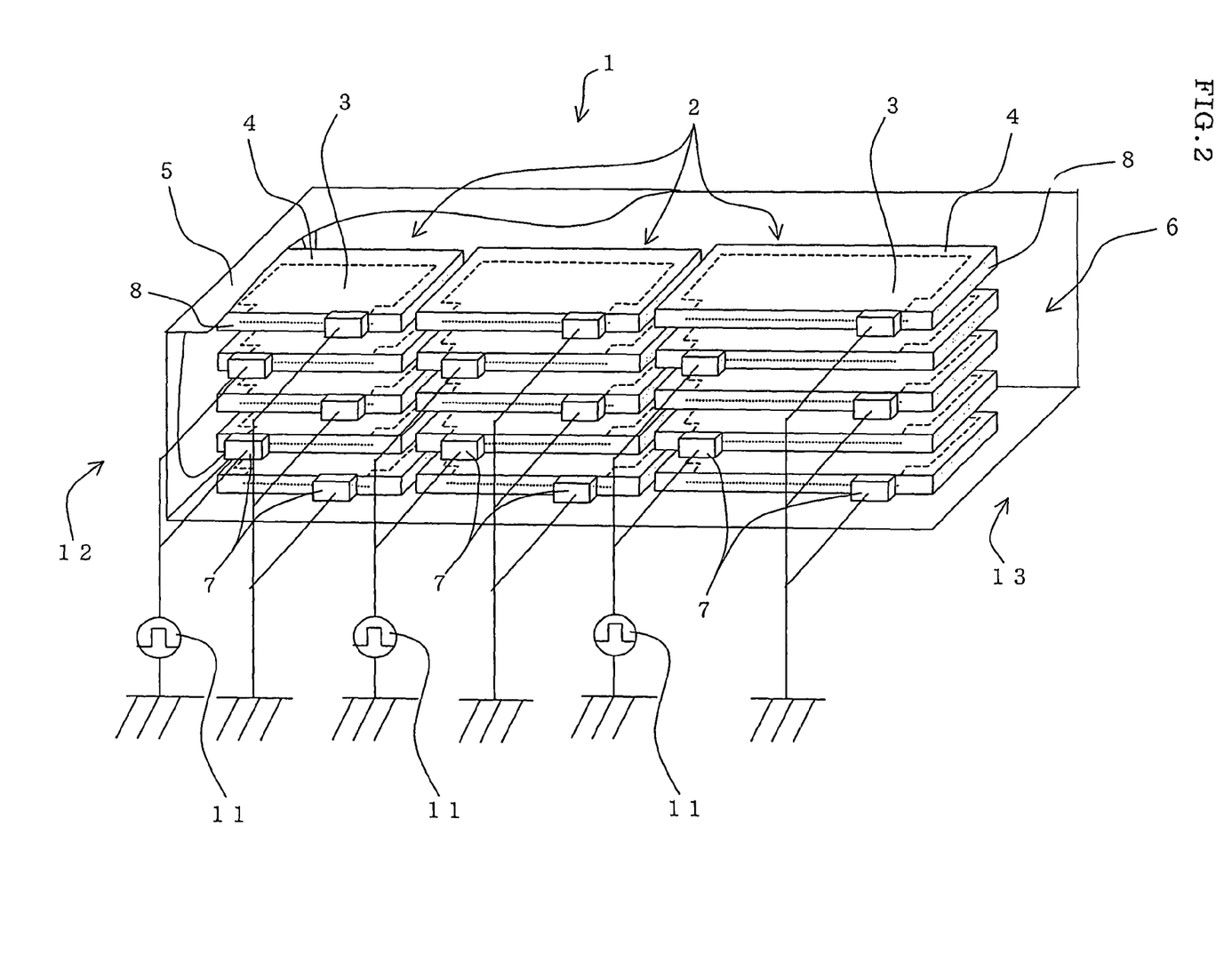
FIG. 2 is a perspective view schematically showing another embodiment of the plasma reactor of the present invention.
Figure 3:
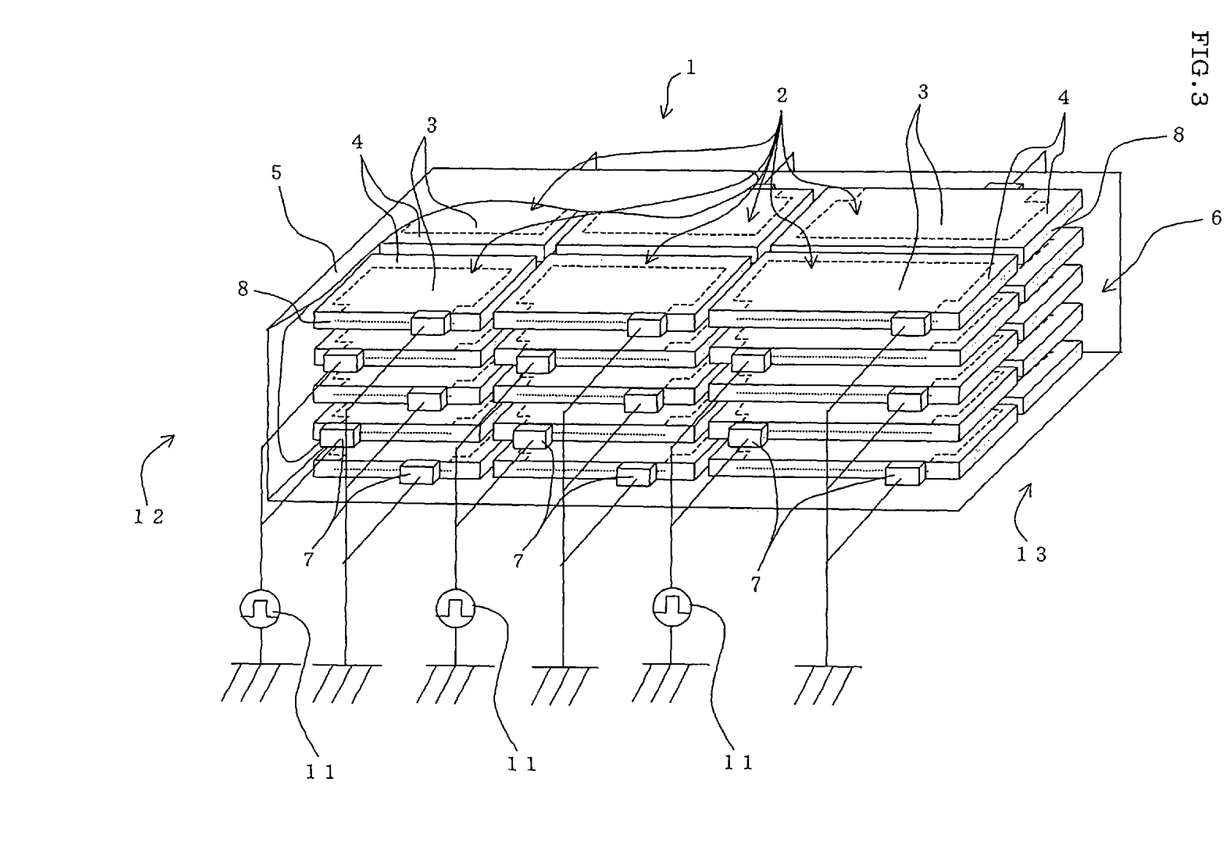
FIG. 3 is a perspective view schematically showing still another embodiment of the plasma reactor of the present invention.

Although a plasma reactor 1 provided with two plasma generating electrodes 2a and 2b inside the gas passage 6 of the casing 5 is shown in FIG. 1, the number of the plasma generating electrodes is not necessarily limited to two, but three or more plasma generating electrodes 2 may be installed in series as shown in FIG. 3, for example. Besides the at least two plasma generating electrodes 2 which are installed in series in relation to the direction of gas flow as shown in FIG. 3 (three plasma generating electrodes 2 in FIG. 3), additional plasma generating electrodes 2 may be installed inside the gas passage 6 of the casing 5, in parallel in relation to the at least two plasma generating electrodes 2 which are installed in series. By installing a plurality of plasma generating electrodes 2 in series and in parallel in relation to the direction of gas flow as shown in FIG. 3, the electric power supplied to each of the plasma generating electrodes 2 and the voltage applied to the conductor 3 can be controlled and adjusted according to the composition of the gas passing through the gas passage 6. For example, because the concentration of NO, particulate matters, and the like contained in the exhaust gas varies according to the gas flow rate and temperature change in the gas passage 6 even in perpendicular to the direction of the gas flow, components contained in the gas can be efficiently reacted by installing plasma generating electrodes in parallel in relation to the gas flow. In the case in which three or more plasma generating electrodes 2 are installed in series as shown in FIG. 2, it is sufficient for at least two plasma generating electrodes 2 to be electrically controlled independently.

The plasma reactor 1 of this embodiment is preferably equipped with two or more plasma generating electrodes 2a and 2b installed linearly and in series inside the gas passage 6 of the casing 5. This configuration makes it possible to reduce the pressure loss in the gas passage 6 of the plasma reactor 1. Therefore, the plasma reactor 1 of this embodiment can be suitably used as an exhaust gas converter of vehicles, for example, in which an increase in the fuel consumption accompanying pressure loss is anticipated.

In the plasma reactor 1 of this embodiment, although there are no specific limitations to the form of the unit electrodes 8a and 8b and the form of the conductors 3a and 3b, in so far as the surface area of the conductor 3a on each unit electrode 8a forming the plasma generating electrode 2a installed on the upstream side 12 of the gas passage 6 is smaller than the surface area of the conductor 3b on the unit electrode 8b forming the plasma generating electrode 2b installed on the downstream side 13 of the gas passage 6, it is preferable that the length of the conductor 3b on each unit electrode 8b forming the plasma generating electrode 2b installed on the downstream side 13 of the gas passage 6 in the gas flow direction is larger than the length of the unit electrode 8a forming the plasma generating electrode 2a installed on the upstream side 12 of the gas passage 6 in the gas flow direction. When the length of the conductor 3b in the gas flow direction is the same as or smaller than the length of the conductor 3a, the area of the opening (an opening from which gas flows into the space between the vis-à-vis facing unit electrodes 8) of the plasma generating electrode 2b formed by the unit electrode 8b is greater than the length of the plasma generating electrode 2a formed by the unit electrode 8a. If two or more such plasma generating electrodes are aligned in series, the area of the openings becomes discontinuous. Particularly, when two or more such plasma generating electrodes are aligned in series close to each other, a turbulent gas flow occurs and a dead space is produced by gas staying in the space in which plasma is generated, resulting in a decrease in the energy efficiency of the reaction. To avoid this problem, a large space is required for installing two or more plasma generating electrodes apart from each other at a prescribed distance or for connecting the two or more plasma generating electrodes using a tapered pipe.

Figure 4:
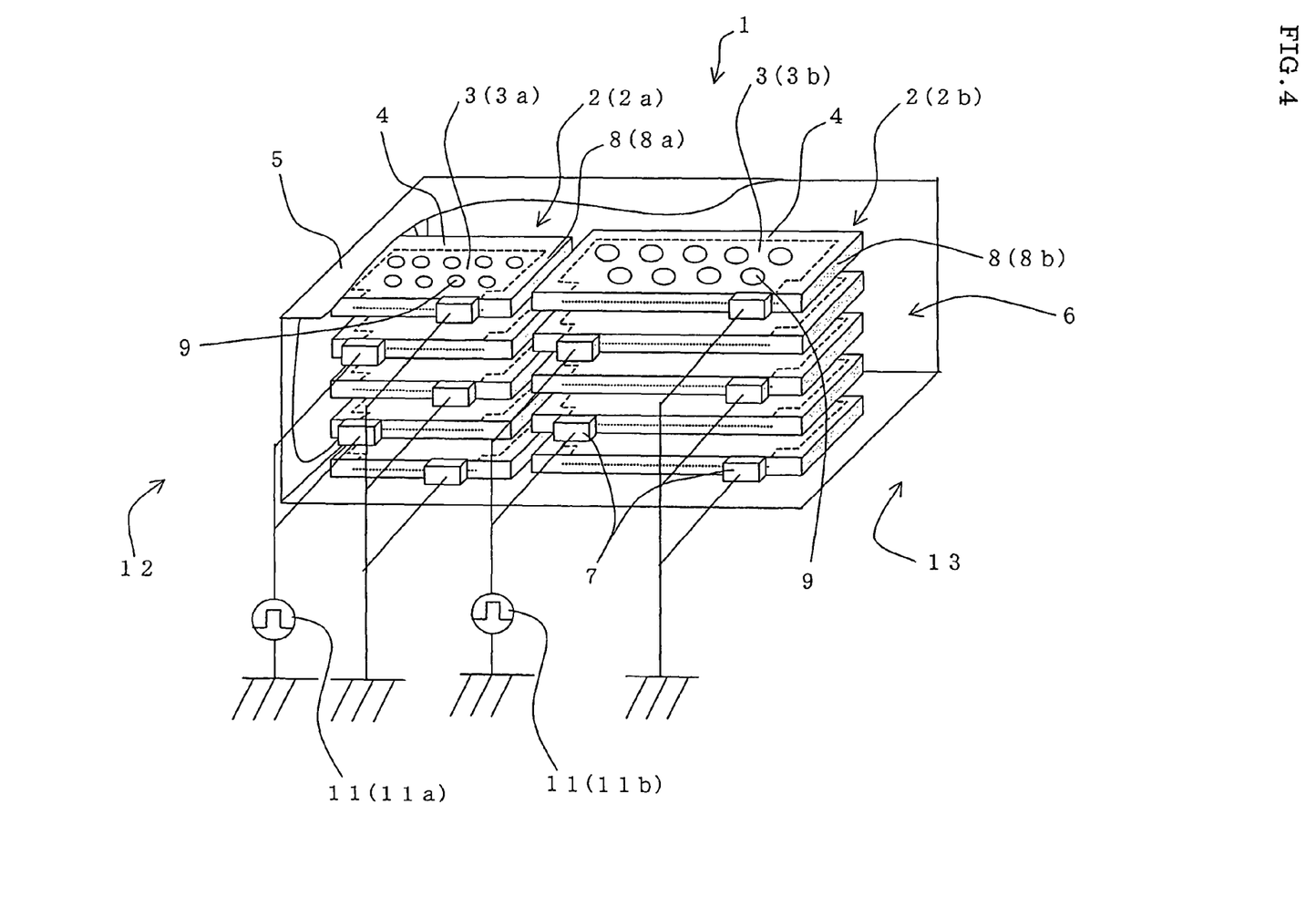
FIG. 4 is a perspective view schematically showing a further embodiment of the plasma reactor of the present invention.
Figure 5:
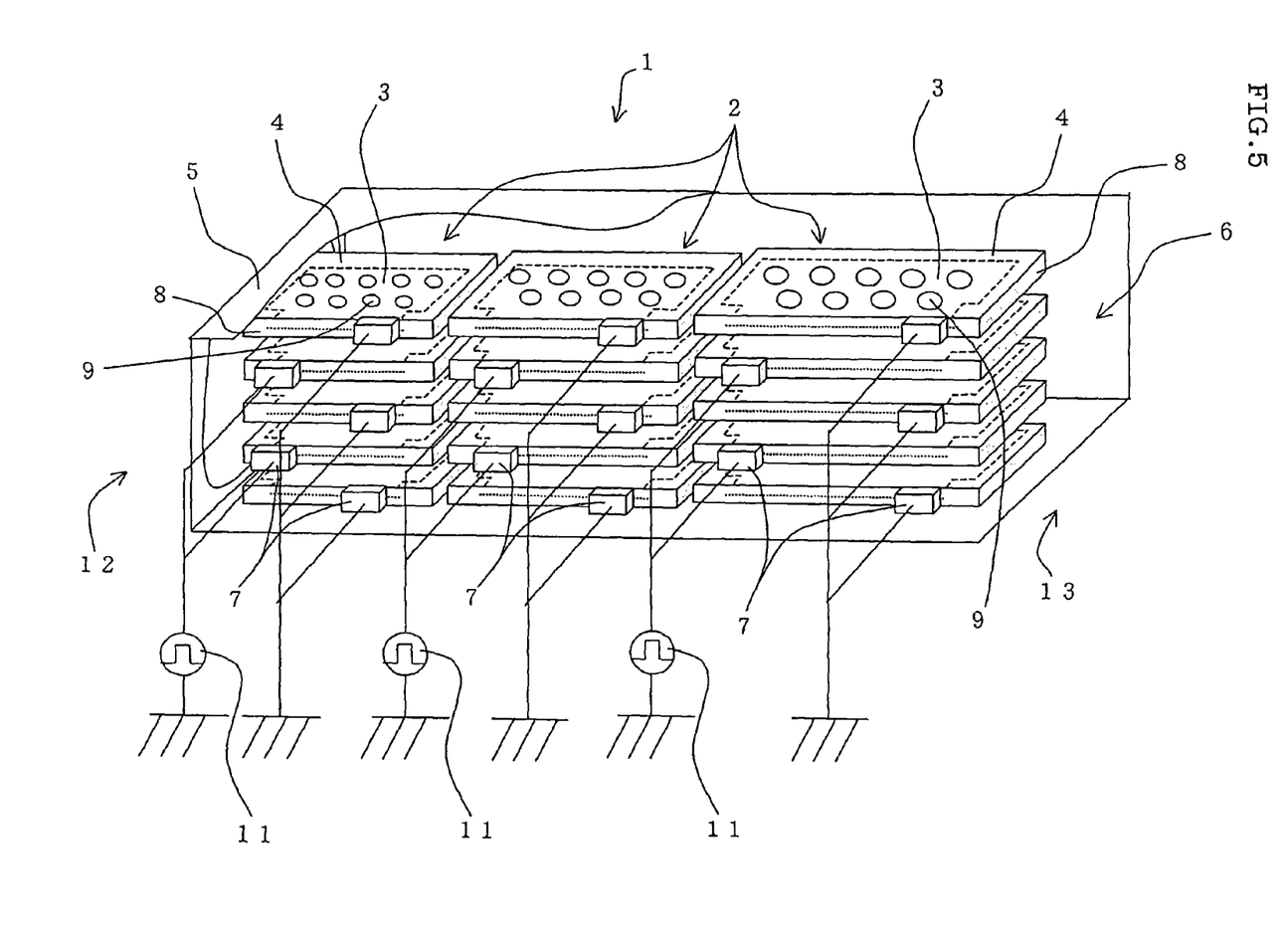
FIG. 5 is a perspective view schematically showing a still further embodiment of the plasma reactor of the present invention.

As shown in FIG. 4 and FIG. 5, the plasma reactor 1 of this embodiment may have a plurality of through-holes 9 bored in the thickness direction through the conductor 3 of the unit electrode 8 forming at least one plasma generating electrode 2. Such through-holes 9 can change the electrostatic capacity of the conductor 3. Although the through-holes 9 are formed through the conductor 3 of the unit electrode 8 for all of the plasma generating electrodes 2 forming the plasma reactor 1 shown in FIG. 4 and FIG. 5, when the through-holes 9 are formed on the conductor 3, it is sufficient that the through-holes 9 are formed through the conductor 3 on at least one plasma generating electrode 2. Here, FIG. 4 and FIG. 5 are perspective views schematically showing the other embodiments of the plasma reactor of the present invention. In these figures, the same components as in the plasma reactor 1 shown in FIG. 1 are indicated by the same symbols, of which the description is omitted. There are no specific limitations to the size and arrangement pattern of the through-holes 9. These are appropriately selected according to type of components and concentration of the fluid passing through the gas passage 6, for example, exhaust emissions.

In addition, as shown in FIG. 1, the plasma reactor 1 of this embodiment is equipped with two or more power supplies 11. Each of the plasma generating electrodes 2 is preferably connected with at least one of the two or more power supplies 11 and electrically controlled independently. This configuration ensures reduction of performance values such as the maximum electric output and the like required for one power supply 11, contributing to downsizing and cost reduction of the power supply 11.

When the plasma reactor 1 of this embodiment is equipped with two or more power supplies 11, these two or more power supplies 11 are preferably pulse power supplies. A pulse power supply can efficiently generate plasma between unit electrodes 8 forming the plasma generating electrodes 2. To ensure efficient plasma generation, the at least two power supplies 11 preferably have at least one SI thyristor therein.

In addition, when the plasma reactor 1 of this embodiment is equipped with further two or more power supplies 11, for example, the amount of electric power (W) supplied to each of the plasma generating electrodes 2a and 2b is preferably designed so that the electric power per unit area (W/mm$^2$) of the conductors 3a and 3b gradually decreases from the plasma generating electrode 2a installed on the upstream side 12 of the gas passage 6 toward the plasma generating electrode 2b installed on the downstream side 13. In this manner, the reaction efficiency of the plasma generating electrode 2b on the downstream side 13 can be controlled to a necessary and sufficient level without increasing or decreasing the reaction efficiency of the plasma generating electrode 2a on the upstream side 12, whereby it is possible to efficiently process specific components contained in the gas passing through the gas passage 6 by reducing the electric power consumed for generating plasma by the entire plasma reactor 1.

The plasma reactor 1 of this embodiment is preferably further provided with a central control means that can integrally control the two or more power supplies 11. As described above, each plasma generating electrode 2 installed inside the gas passage 6 has an optimum amount of electric power to be supplied at each position. In addition, such an optimum amount of electric power changes over time. For this reason, provision of a central control means for the two or more power supplies 11 can further increase the reaction efficiency.

The integral control using this control means is preferably pulse energy control in the two or more power supplies 11 and/or pulse repetition cycle control in the two or more power supplies 11. As a preferable example of such a control means, a system of sending the output of a thermal sensor, a NO$_x$ sensor, a soot sensor, and the like provided in the later stage of each of the plasma generating electrodes 2a and 2b to an engine control unit (ECU) and independently controlling the input energy and pulse frequency of each of the two or more power supplies 11 according to a previously input program to obtain the maximum NO conversion effect and particulate matters-removal effect by the minimum power supply can be given.

In the plasma reactor 1 of this embodiment, it is preferable that this control means integrally control two or more power supplies 11 to reduce the pressure difference between the upstream side 12 and the downstream side 13 of the gas passage 6, that is, the pressure loss of the gas passage 6. For example, when combustion exhaust gas containing particulate matters and the like is caused to pass through the gas passage 6, particulate matters contained in the combustion exhaust gas accumulates in the space between the unit electrodes 8 and produces a pressure difference (a pressure loss) in the gas passage 6. In this instance, because a comparatively large amount of particulate matters contained in the combustion exhaust gas accumulates in the plasma generating electrode 2a installed on the upstream side 12 of the gas passage 6, the power supply 11 is controlled so that the plasma generating electrode 2a installed on the upstream side 12 is supplied with a comparatively large amount of power so as to remove the comparatively large amount of accumulated particulate matters, but the plasma generating electrode 2b installed on the downstream side 13 is supplied with an amount of electric power sufficient to remove the particulate matters accumulated on the downstream side 13, which is smaller than the electric power supplied to the plasma generating electrode 2a on the upstream side 12. The pressure difference (pressure loss) of the gas passage 6 can be measured by, for example, installing a manometer between the unit electrodes 8 forming each plasma generating electrode 2.

When the prescribed component contained in the gas is nitrogen monoxide (NO) in the plasma reactor 1 of this embodiment, it is preferable that this control means integrally controls two or more power supplies 11 so that the amount of NO on the downstream side 13 of the gas passage 6 can be decreased. The plasma reactor 1 of this embodiment configured in this manner can be suitably used in exhaust gas treating devices and the like for treating exhaust emissions from vehicles.

The above-described reaction efficiencies such as NO conversion efficiency and particulate matters-removing efficiency can be controlled by the amount of electric power supplied per unit area (W/mm$^2$) of the conductor 3 of each plasma generating electrode 2. It is preferable to continuously control the system by measuring the concentration of NO and the amount of particulate matters at each position of the gas passage 6, as well as the pressure difference (pressure loss) and the like at each position, while changing the amount of electric power supplied per unit area (W/mm$^2$) of the conductor 3, so that the amount of electric power supplied per unit area (W/mm$^2$) of the conductor 3 can increase the NO conversion efficiency and particulate matters-removing efficiency.

In addition, in the plasma reactor 1 of this embodiment, it is preferable that each plasma generating electrode 2 installed inside the gas passage 6 in the casing 5 can be displaced independently, so that if one of the plasma generating electrodes 2 breaks down, only this one plasma generating electrode 2 can be replaced for repairing the plasma reactor 1. This configuration thus provides excellent maintenance performance.

The plasma generating electrode 2 used in the plasma reactor 1 of this embodiment is formed from opposingly arranged two or more unit electrodes 8, each being a basic unit of electrode. Each unit electrode 8 has a plate-like conductor 3 and a ceramic dielectric 4 provided on at least one of the surfaces of the conductor 3. The ceramic dielectric 4 shown in FIG. 1 covers the surfaces of the conductor 3 on both sides. The unit electrode 8 shown in FIG. 1 has an electric conduction terminal 7 for electrically connecting the conductor 3 covered with the ceramic dielectric 4 with the power supply 11.

The ceramic dielectric 4 may be made of any material that can be used as a dielectric body without any specific limitations. For example, materials containing at least one compound selected from the group consisting of aluminum oxide, magnesium oxide, silicon oxide, silicon nitride, aluminum nitride, mullite, cordierite, magnesium-calcium-titanium type oxide, barium-titanium-zinc type oxide, and barium-titanium type oxide are preferably used. A ceramic dielectric 4 excelling in thermal shock resistance can be obtained by using a material containing these compounds. The ceramic dielectric 4 can be formed using a tape-shaped ceramic green sheet or a sheet obtained by extrusion molding, for example. A flat plate formed by powder dry pressing may also be used. The size of the ceramic dielectric 4 can be appropriately determined according to the application without any specific limitations.

Any material that can effectively produce discharge between opposing electrodes may be used as the conductor 3 without any specific limitations. For example, materials containing at least one metal selected from the group consisting of tungsten, molybdenum, manganese, chromium, titanium, zirconium, nickel, iron, silver, copper, platinum, and palladium are preferably used.

The conductor 3 in the form of a thin film is preferable. Such a thin film is prepared by, for example, coating a paste containing the above-mentioned metal on the surface of a sheet-like ceramic dielectric 4. As preferable examples of the specific coating method, screen printing, calendar rolling, spraying, electrostatic painting, dip coating, knife coating, ink-jetting, chemical vapor deposition, physical vapor deposition, and the like can be given. A thin film of conductor 3 exhibiting excellent surface smoothness can be easily formed using these methods.

It is preferable that at least one end of the plasma generating electrode 2 used in the plasma reactor 1 of this embodiment be in a position that provides a space with a predetermined interval between the unit electrodes 8 which counter vis-à-vis.

The material for the casing 5 is not particularly limited. For example, ferrite-type stainless steel and the like having excellent conductivity, being lightweight and inexpensive, and showing only a small amount of deformation due to thermal expansion are preferably used.

There are no specific limitations to the capacity of the power supply 11 used in the plasma reactor 1. When the plasma reactor 1 is installed in the exhaust-gas system of vehicles, for example, it is preferable that the current supplied to the plasma generating electrode 2 from the power supply 11 be a direct current at a voltage of 1 kV or more, a pulse current having a peak voltage of 1 kV or more and a pulse rate per second of 100 or more (100 Hz or more), an alternating current having a peak voltage of 1 kV or more and a frequency of 100 or more (100 Hz or more), or a current generated by superimposing two of these currents. In this manner, plasma can be efficiently generated.

As described above, since the plasma reactor 1 of this embodiment is provided with two or more plasma generating electrodes 2a and 2b which are installed in series inside the gas passage 6 in the casing 5, with each plasma generating electrode being electrically controlled independently, and the surface area of the conductor 3 on each unit electrode 8a forming the plasma generating electrode 2a installed on the upstream side 12 of the gas passage 6 is smaller than the surface area of the conductor 3b on the unit electrode 8b forming the plasma generating electrode 2b installed on the downstream side 13 of the gas passage 6, the plasma reactor can reduce the electric power supplied for generating plasma and can efficiently react specific components contained in the gas passing through the gas passage. If the plasma reactor is further provided with two or more power supplies 1, the reaction efficiency can be further increased by controlling these power supplies.

EXAMPLES

The invention is described below in detail by way of examples. However, the invention should not be construed as being limited to the following examples.

Example 1

A plasma reactor (Example 1) having three plasma generating electrodes installed in series in the gas flow direction inside the gas passage in the casing was prepared. The plasma generating electrode (a first plasma generating electrode) installed on the uppermost stream side was prepared by arranging 40 sheets of vis-à-vis facing unit electrodes, each made from a square plate-like conductor on which a ceramic dielectric was provided. The length (width) of the side from which gas enters the unit electrode was 84 mm and the length (depth) in the gas flow direction was 15 mm. A 0.5 mm space was provided between vis-à-vis facing unit electrodes. The plasma generating electrode (a second plasma generating electrode) installed in the intermediate in the gas flow direction was prepared by arranging 40 sheets of vis-à-vis facing unit electrodes, each made from a square plate-like conductor on which a ceramic dielectric was provided. This plasma generating electrode was the same as the first plasma generating electrode, except that the length (depth) in the gas flow direction was 35 mm. The plasma generating electrode (a third plasma generating electrode) installed in the most downstream side was prepared by arranging 40 sheets of vis-à-vis facing unit electrodes, each made from a square plate-like conductor on which a ceramic dielectric was provided. This plasma generating electrode was the same as the first plasma generating electrode, except that the length (depth) in the gas flow direction was 50 mm.

The first, second, and third plasma generating electrodes of this plasma reactor were respectively supplied with 150 W (450 W in total) of electric power from different power supplies to generate plasma between the unit electrodes. Exhaust gas containing 2.3 g/h of particulate matters (particulate suspended solid) at a temperature of 220° C. was fed to the gas passage at a flow rate of 1 $m^3$/mm. to measure the particulate matters-removing efficiency from the exhaust gas. The particulate matters-removing efficiency (%) is determined by subtracting the amount of particulate matters discharged from the downstream side of the gas passage while plasma is generated (amount of untreated particulate matters) from the amount of particulate matters discharged from the downstream side of the gas passage when plasma is not generated between the unit electrodes (total amount of particulate matters) and dividing the result by the total amount of particulate matters. The amount of particulate matters discharged from the downstream side of the gas passage was determined by measuring the weight of particulate matters collected by a filter paper provided on the downstream side of the gas passage. In this example, particulate matters-removing efficiency was 85% and the plasma generator treated the exhaust gas at this efficiency for the entire test period of 24 hours.

Comparative Example 1

A plasma generating electrode was prepared by arranging 40 sheets of unit electrodes vis-à-vis facing, each made from a conductor on which a ceramic dielectric was provided. A plasma reactor (Comparative Example 1) was prepared by arranging this plasma generating electrode inside a casing. The length (width) of the side from which gas enters the unit electrode of this plasma generating electrode was 84 mm and the length (depth) in the gas flow direction was 100 mm. A 0.5 mm space was provided between the vis-à-vis facing unit electrodes. This plasma reactor (Comparative Example 1) can generate plasma in a space approximately as large as the space in which the plasma reactor of Example 1 can generate plasma.

The particulate matters-removing efficiency of this plasma reactor of Comparative Example 1 was measured in the same manner as in Example 1, while changing the amount of electric power supplied to the plasma generating electrode. Although 600 W of electric power was required for obtaining approximately the same particulate matters-removing efficiency of 85% as in Example 1, the plasma reactor could be operated for the entire test period of 24 hours at this efficiency.

When the plasma reactor of Comparative Example 1 was supplied with 450 W of electric power, a particulate matters-removing efficiency of 85% was maintained for 30 minutes. After that, the efficiency continued to decrease to as low as 10% in eight hours, whereupon the test was terminated. The inside of this plasma reactor was observed after the test to find that the electrode was almost filled with particulate matters.

After generating plasma by supplying each of the first to third plasma generating electrodes of the plasma reactor of Example 1 with an electric power of 150 W (450 W in total), an exhaust gas containing nitrogen ($N_2$) as a base gas, 15 vol % of oxygen ($O_2$), 4.2 vol % of carbon dioxide ($CO_2$), 1,300 ppm of carbon monoxide (CO), 190 ppm of nitrogen monoxide (NO), 200 ppm of nitrogen oxides ($NO_x$), 250 ppm of propylene ($C_3H_6$), and 4.5 vol % of water ($H_2O$) at a temperature of 213° C. was passed through the plasma reactor of Example 1 at a flow rate of 0.5 m$^3$/min to measure the conversion efficiency of nitrogen monoxide (NO) into a nitrogen dioxide ($NO_2$) (hereinafter referred to from time to time as "NO conversion efficiency"). The NO conversion efficiency (%) is determined by subtracting the amount of NO discharged from the downstream side of the gas passage while plasma is generated (amount of non-converted NO) from the amount of NO discharged from the downstream side of the gas passage when plasma is not generated between the unit electrodes (total amount of NO) and dividing the result by the total amount of NO. The amount of NO discharged from the downstream side of the gas passage was measured by the chemical luminescence method. The NO conversion efficiency of the plasma reactor of Example 1 was 80%.

In the same manner as above, after generating plasma by supplying the plasma generating electrode of the plasma reactor of Comparative Example 1 with 600 W of electric power, an exhaust gas containing nitrogen ($N_2$) as a base gas, 15 vol % of oxygen ($O_2$), 4.2 vol % of carbon dioxide ($CO_2$), 1,300 ppm of carbon monoxide (CO), 190 ppm of nitrogen monoxide (NO), 200 ppm of nitrogen oxides ($NO_x$) 250 ppm of propylene ($C_3H_6$), and 4.5 vol % of water ($H_2O$) at a temperature of 213° C. was passed through the plasma reactor at a flow rate of 0.5 m$^3$/min to measure the conversion efficiency of nitrogen monoxide (NO) into a nitrogen dioxide ($NO_2$) to find that the NO conversion efficiency was 80%. When the plasma reactor was supplied with electric power of 450 W, the NO conversion efficiency was 68%.

INDUSTRIAL APPLICABILITY

Since the plasma reactor of the present invention can be operated with reduced electric power for generating plasma and can efficiently treat a fluid to be processed, it is suitably used for an exhaust emission converter and the like for treating specific components contained in exhaust gas and the like.

What is claimed is:
1. A plasma reactor comprising
a plasma generating electrode composed of a plurality of unit electrodes disposed facing vis-à-vis at a prescribed interval, each of the unit electrodes having a plate-shaped conductor and a ceramic dielectric provided on at least one the surface of the plate-shaped conductor,
a passage for gas containing specific components, and
a casing for housing the plasma generating electrode and the gas passage,
wherein two or more of the plasma generating electrodes are installed in series inside the gas passage in the casing, with each plasma generating electrode being electrically controlled independently, and
a surface area of the conductor of the unit electrode forming the plasma generating electrode installed on an upstream side of the gas passage is smaller than a surface area of the conductor of the unit electrode forming the plasma generating electrode installed on a downstream side of the gas passage,
whereby plasma can be generated between each of the unit electrodes by supplying each of the plasma generating electrodes with independently controlled electric power.

2. The plasma reactor according to claim 1, wherein two or more of the plasma generating electrodes are installed linearly and in series inside the gas passage in the casing.

3. The plasma reactor according to claim 1, wherein the length of the conductor of each unit electrode forming the plasma generating electrode installed on the downstream side of the gas passage in the gas flow direction is larger than the length of the unit electrode forming the plasma generating electrode installed on the upstream side of the gas passage 6 in the gas flow direction.

4. The plasma reactor according to claim 1, wherein the ceramic dielectric on the unit electrode is installed so as to cover both sides of the surface of the conductor.

5. The plasma reactor according to claim 1, comprising two or more power supplies, two or more of the plasma generating electrodes being connected to any one of the two or more power supplies and each being electrically controlled independently.

6. The plasma reactor according to claim 5, wherein the two or more power supplies are pulse power supplies.

7. The plasma reactor according to claim 5, further comprising control means for integrally controlling the two or more power supplies.

8. The plasma reactor according to claim 7, wherein integral control using the control means includes pulse energy control in each of the two or more power supplies and/or pulse repetition cycle control in each of the two or more power supplies.

9. The plasma reactor according to claim 7, wherein the control means integrally controls the two or more power supplies to reduce the pressure difference between the upstream side and the downstream side of the gas passage.

10. The plasma reactor according to claim 5, wherein the two or more pulse power supplies include at least one SI thyristor.

11. The plasma reactor according to claim 1, wherein the amount of electric power (W) supplied to each of the plasma generating electrodes is designed so that the electric power per unit area (W/mm$^2$) of the conductors gradually decreases from the plasma generating electrode installed on the upstream side of the gas passage toward the plasma generating electrode installed on the downstream side.

12. The plasma reactor according to claim 1, wherein each of the plasma generating electrodes installed inside the gas passage in the casing can be displaced independently.

* * * * *